United States Patent
Li

(10) Patent No.: US 9,711,221 B1
(45) Date of Patent: Jul. 18, 2017

(54) NONVOLATILE RANGE-CHECKING CONTENT ADDRESSABLE MEMORY

(71) Applicant: Wisconsin Alumni Research Foundation, Madison, WI (US)

(72) Inventor: Jing Li, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/171,815

(22) Filed: Jun. 2, 2016

(51) Int. Cl.
G11C 15/00 (2006.01)
G11C 15/04 (2006.01)
G11C 16/04 (2006.01)

(52) U.S. Cl.
CPC ........ *G11C 15/046* (2013.01); *G11C 16/0483* (2013.01)

(58) Field of Classification Search
CPC ......... G11C 13/0002–13/00; G11C 2013/0032
USPC .................................. 365/49.11–49.18, 148
See application file for complete search history.

(56) References Cited

U.S. PATENT DOCUMENTS

| 7,382,637 | B1 * | 6/2008 | Rathnavelu | G11C 15/00 365/189.05 |
| 2002/0161969 | A1 * | 10/2002 | Nataraj | G06F 17/30982 711/108 |

OTHER PUBLICATIONS

Jing Li et al; "1 Mb 0.41 µm² 2T-2R Cell Nonvolatile TCAM With Two-Bit Encoding and Clocked Self-Referenced Sensing." IEEE Journal of Solid-State Circuits 49, No. 4 (2014) 896-907, US.
Young-Deok Kim et al.; "A high-speed range-matching TCAM for storage-efficient packet classification." IEEE Transactions on Circuits and Systems I: Regular Papers 56, No. 6 (2009): 1221-1230. US.
Young-Deok Kim et al,: "A storage-and power-efficient range-matching TCAM for packet classification." In 2006 IEEE International Solid State Circuits Conference—Digest of Technical Papers. 2006. KR.

\* cited by examiner

*Primary Examiner* — Han Yang
(74) *Attorney, Agent, or Firm* — Boyle Fredrickson, S.C.

(57) ABSTRACT

A computer memory provides for range-matching capabilities using a hybrid combination of transistors and multiple resistive memory devices serving in a dual capacity as storage and logic. The result is an extremely compact, nonvolatile range-matching, content addressable memory.

20 Claims, 7 Drawing Sheets

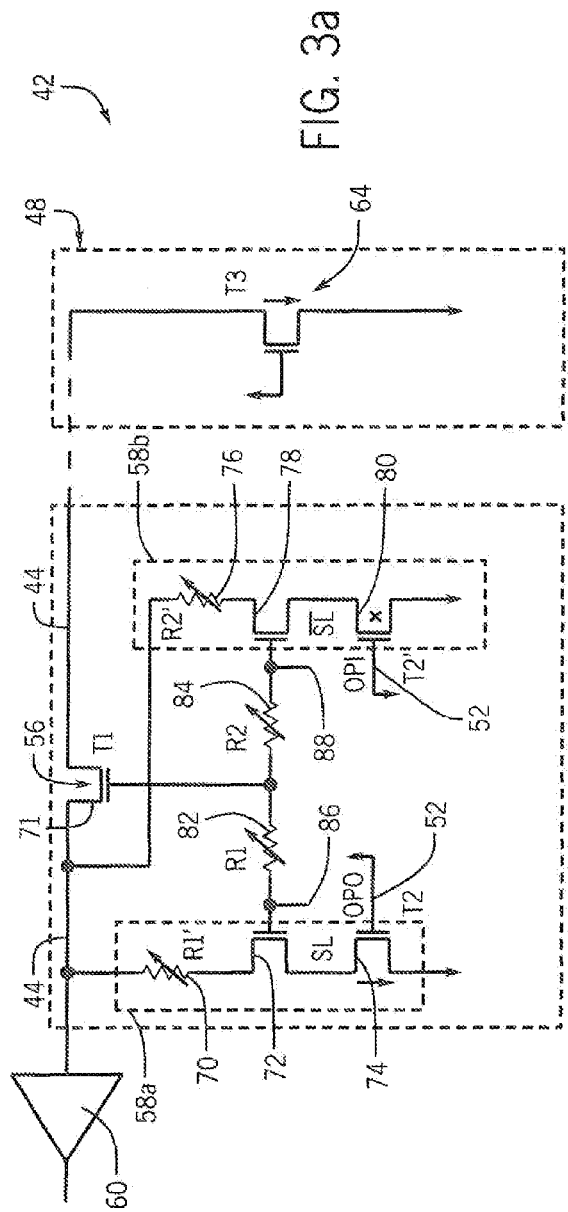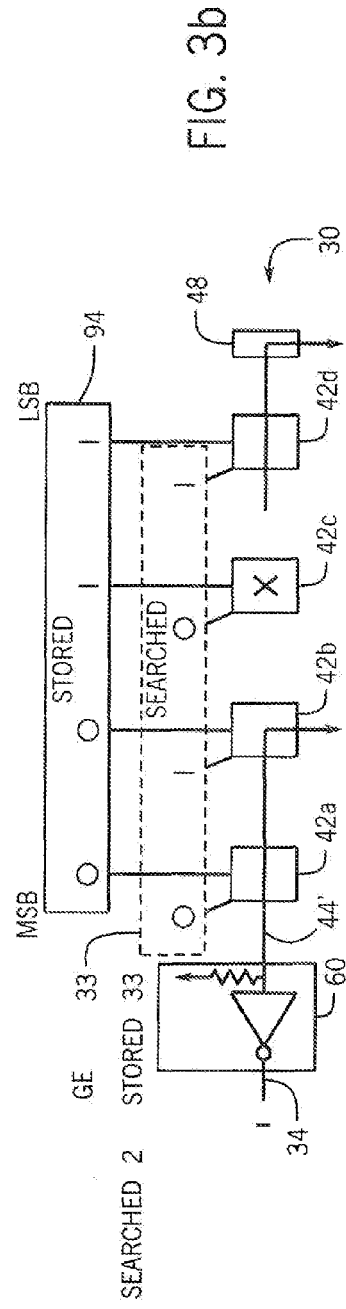

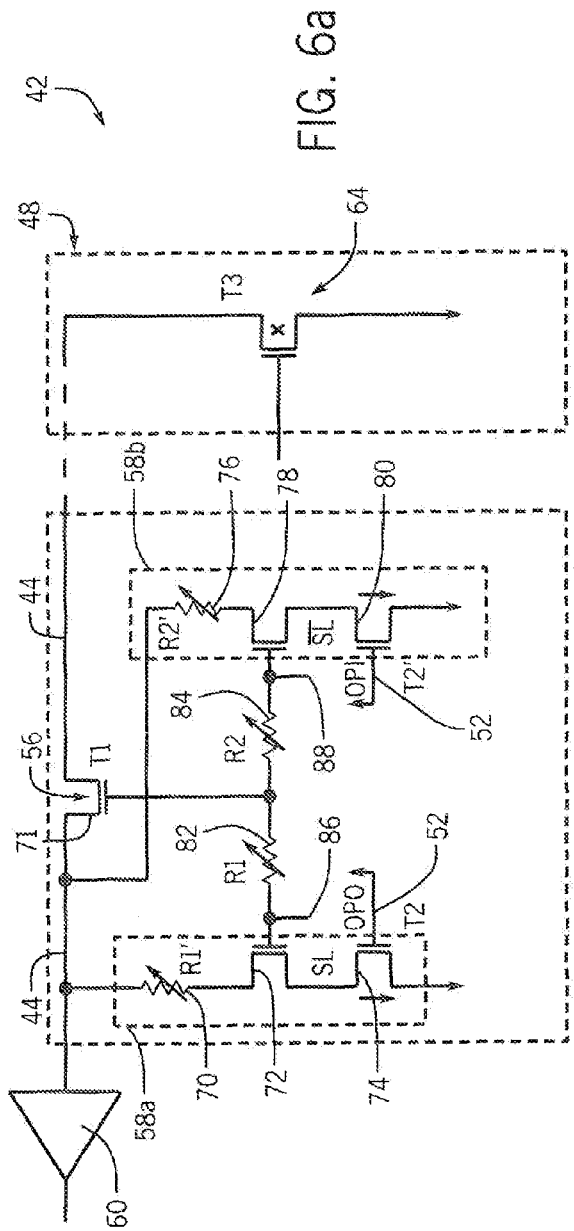

NONVOLATILE RANGE-CHECKING CONTENT ADDRESSABLE MEMORY

STATEMENT REGARDING FEDERALLY SPONSORED RESEARCH OR DEVELOPMENT

--

CROSS REFERENCE TO RELATED APPLICATION

--

BACKGROUND OF THE INVENTION

The present invention relates to an improved architecture for content addressable memories and the like and in particular to a range-matching, content addressable memory with an extremely compact architecture.

A common computational task for an electronic computer is that of searching for a particular value in memory. For example, in routing packets over a network, it may be necessary to search for a packet address in memory in order to route the packet through a correct port.

Conventional random access memory operates by receiving an address, designating a memory location and providing access to the data stored at that received address, for example, reading that data or modifying that data. In searching operations, random-access memories typically must access multiple memory addresses in series before a determination may be reached as to whether the data exists in the memory and its location. The time required to complete each sequential memory access can slow the searching operation.

Associative memories (also referred to as content addressable memories) provide a faster way of searching for data. Such memories may receive the value of the data being searched for (a search pattern) and simultaneously review all memory addresses for that pattern. The associative memory typically returns a list of storage addresses holding data that matches the search pattern and these addresses may serve as a link to other needed data. A specialized processor (for example, a network processor) working with an associative memory can perform searches far in excess of the speeds obtainable with conventional random-access memory.

Frequently it is desired to perform a memory search for any value within a particular range of values. This problem may occur, for example, in classifying packets on the Internet or the like where it is desired to know if a packet header falls within a predetermined range of addresses. A straightforward implementation of this problem in a content addressable memory would be to store each value within the range as a separate entry in the content addressable memory; however, this is clearly an inefficient solution.

An alternative approach to searching for ranges can be implemented with ternary content addressable memories (TCAM) which allow for the storage of values of 0, 1, and X (don't care). The placement of X values in the least significant bits in a word stored in the TCAM allows that entry to define a range of different search values so long as the range aligns with a power of two. Defining an arbitrary range can be performed by logical combinations of TCAM but this can quickly become cumbersome and impractical.

Alternatively, it is known to construct range-matching, content addressable memories (RMCAM) in which the associative memory receives entries for upper and lower range ranges for a search, each range providing a numeric value together with a desired arithmetic relationship (for example, EQUAL, GREATER THAN OR EQUAL, LESS THAN OR EQUAL) between a received search pattern and the stored range data. Thus, instead of identifying whether the search pattern equals the value stored in the content addressable memory, the range-matching, content addressable memory identifies whether the search pattern has the desired arithmetic relationship with respect to the range value. A range combining structure of AND gates logically combines outputs from two rows of the range-matching, content addressable memory to provide an output indicating that the received search pattern is within a range defined by the upper and lower range values.

Current range-matching, content addressable memories employ complex memory cell architectures using many transistors for each stored bit. These complex memory cells, when scaled by the large number of required memory cells, can substantially reduce memory densities and increase power consumption of the resulting memory.

SUMMARY OF THE INVENTION

The present invention produces a highly compact range-matching, content addressable memory by combining programmable multiple resistive elements with conventional transistors. The multiple resistive elements implement both a nonvolatile memory and logic functions to greatly reduce the number of transistors and the total number of parts required.

In one embodiment, the invention provides a content addressable memory implementing range-matching and including a set of memory cells arranged in logical rows and columns. Together, these memory cells are adapted to receive an input pattern in parallel along the columns and to provide a row output for each given row of memory cells evaluating the input pattern with respect to stored values of the memory cells of the given row. Each memory cell includes:

(a) a pattern input receiving a portion of the input pattern;

(b) a resistive memory holding a portion of the stored values in resistive states of resistive elements;

(c) programming inputs receiving programming data describing a given arithmetic relationship from a set of arithmetic relationship including equality and inequalities;

(d) transistor logic circuitry evaluating the portion of the input pattern and the portion of the stored values using the given arithmetic relationship of the programming inputs; and (e) at least one output adapted to combine the evaluation of the transistor logic circuitry of the memory cell with the evaluation of the other memory cells to provide the row output indicating whether stored values of the memory cells of a row holding the memory cell have the given arithmetic relationship with respect to the input pattern.

It is thus a feature of at least one embodiment of the invention to provide an extremely compact range-matching, content addressable memory by combining resistive programmable elements together with transistor logic.

The given arithmetic relationships maybe selected from the group consisting of EQUAL, GREATER THAN, LESS THAN.

It is thus a feature of at least one embodiment of the invention to provide standard range-matching primitives useful for packet routing and the like.

The given arithmetic relationships may also include NOT EQUAL.

It is thus a feature of at least one embodiment of the invention to provide an additional arithmetic relationship.

The present inventors have determined that navigation rules can be important for categorizing emerging threats, for example, as deduced from a study of the open-source emerging threat database (www.emergingthreats.com).

The content addressable memory may further include a switch element associated with the memory elements in each row and providing a switchable path between the row output and a predetermined logical voltage level as a function of whether the given arithmetic relationship is NOT EQUAL and the relationship between the stored values and the input pattern is equal.

It is thus a feature of at least one embodiment of the invention to provide a mechanism for implementing a NOT EQUAL relationship without increasing the circuitry of individual memory cells.

The resistive memory may include a first and second resistive element storing a single bit of the portion when configured to have complementary resistive states.

It is thus a feature of at least one embodiment of the invention to employ multiple programmable resistive elements to encode memory values so that these resistive elements may also serve in a logical capacity for implementing the range checking.

The first and second resistors may be connected in series to provide a resistive bridge across voltages representing complementary representations of a bit of the input pattern to which the single bit of the portion will be compared.

It is thus a feature of at least one embodiment of the invention to employ programmable resistive elements in a bridge structure to generate a control signal that is a function both of the stored memory bit and received pattern bit.

A junction between the first and second resistors of the resistive bridge may control an electrical switch interconnecting the memory cell to a neighboring memory cell to provide the at least one output.

It is thus a feature of at least one embodiment of the invention to use the resistive programmable elements both for memory and performing range-matching logic.

The content addressable memory may further include a third and fourth resistor in parallel between the at least one output and a predetermined logical voltage level independently switchable by the transistor logic circuitry to bring the output to the predetermined logical voltage level.

It is thus a feature of at least one embodiment of the invention to replace substantial transistor circuitry with programmable resistive elements for significant parts count reductions.

The memory elements each may include a first and second switch element controlled by the transistor logic circuitry and wherein the first switch elements of the memory elements are connected in series by means of the at least one output of the memory cells to provide the row output and wherein the second switch operates to connect the at least one output predetermined logic level under control of the transistor logic circuitry.

It is thus a feature of at least one embodiment of the invention to make use of a wired AND structured to allow inter-cooperation between the memory cells as is needed for the calculation of the qualities and inequalities among multiple bits distributed in the memory cells.

The second switch element may include two independently controllable switches in parallel independently controlled by the logic circuitry.

It is thus a feature of at least one embodiment of the invention to provide an alternative switch topology that greatly reduces parts count.

These particular objects and advantages may apply to only some embodiments falling within the claims and thus do not define the scope of the invention.

BRIEF DESCRIPTION OF THE DRAWINGS

FIGS. 3a and 3b are figures similar to FIGS. 2a and 2b showing the memory cells configured to implement a GREATER THAN OR EQUAL arithmetic relationship;

FIGS. 6a and 6b are figures similar to FIGS. 3a and 3b showing the memory cells configured to implement a PREFIX EQUAL arithmetic relationship.

DETAILED DESCRIPTION OF THE PREFERRED EMBODIMENT

Figure 1:
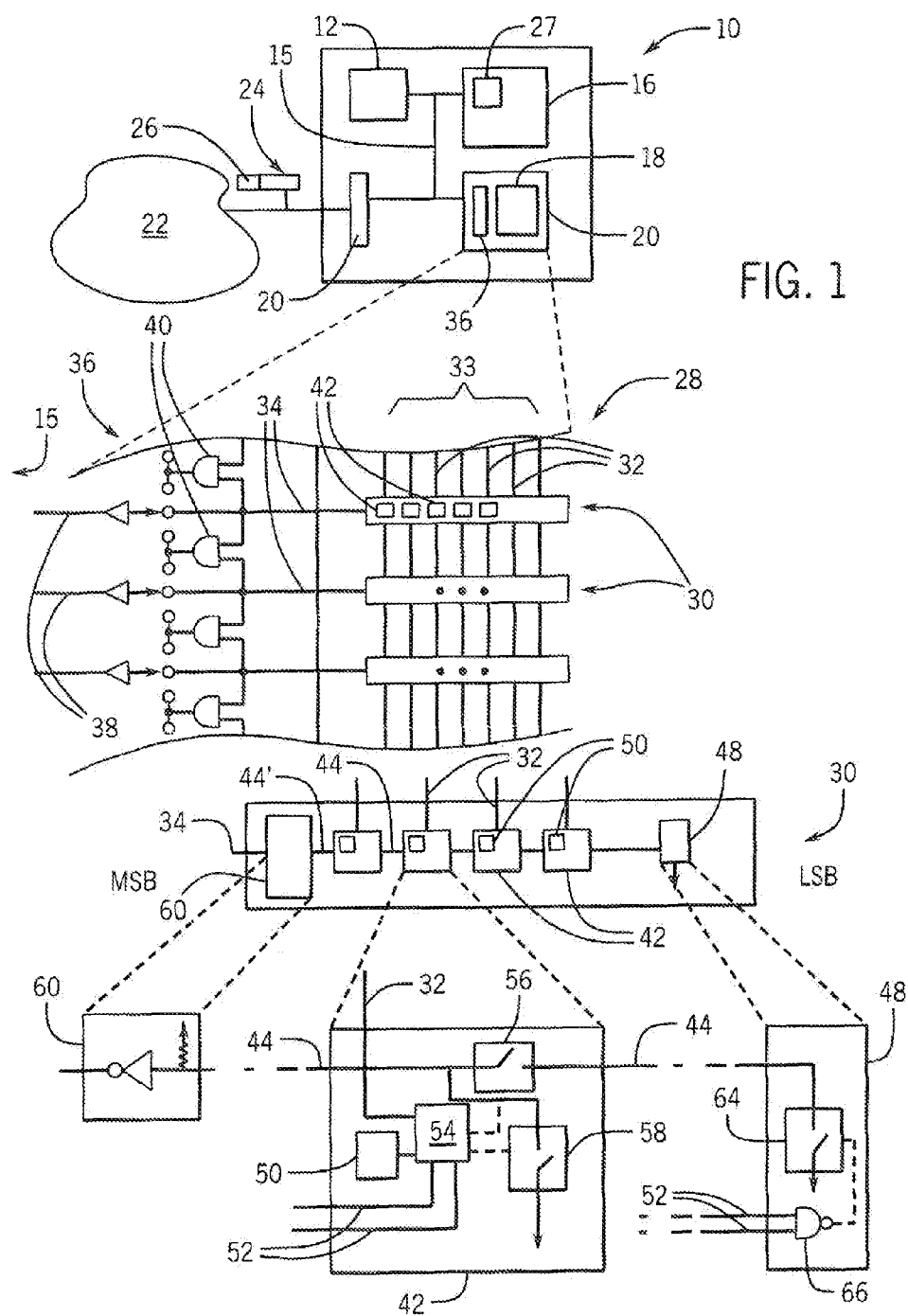
FIG. 1 is a block diagram showing a computer having a range-matching, content addressable memory of the present invention and showing successive fragmentary expansions detailing the internal architecture of the range-matching, content addressable memory, one row of the range-matching, content addressable memory, and an internal block diagram of one memory cell of the range-matching, content addressable memory together with a terminating switch and a sense amplifier used for each row of memory cells.

Referring now to FIG. 1, an electronic computer architecture 10 according to the teachings of the present invention may provide for a processor unit 12, for example, comprising one or more single or multicore electronic computer processors. The computer processors of the processor unit 12 may be general-purpose processors executing a variety of arithmetic and logical instructions for general-purpose computational problems or maybe specially designed hardware, for example, for network switching. The processor unit 12 may communicate through a bus system 15 with random-access memory 16 and with associative memory 18, the latter as will be discussed in greater detail below.

The electronic computer architecture 10 may include an interface 20 for connecting to the Internet 22 or the like for receiving data packets 24, the latter having data headers 26 that may be processed by the electronic computer architecture 10, for example, in the capacity of a router switch or firewall. In this regard, the processor unit 12 may execute a program 27, for example, held in random-access memory 16, to receive the packets 24 and categorize the headers 26 through a lookup process using the associative memory 18. The results of this analysis may be used to further process the packets 24, for example, to route the packets 24, block the packets 24, or give the packets 24 a transmission priority under a quality of service level system. As will be discussed in more detail below, the executing program 27 may provide signals from the processor unit 12 to the associative memory 18 configuring it with respect to search ranges.

Referring still to FIG. 1, and to the first expansion within that figure, the associative memory 18 will include a memory cell array 28 providing multiple rows 30 of memory cells 42. Generally, the rows 30 of memory cells 42 receive a search pattern 33 in parallel through column conductors 32 and each row 30 provides search results with respect to that search pattern 33 in parallel through row outputs 34. The row outputs 34, for example, indicate whether the search pattern on the column conductors 32 matches data stored in the memory cells 42 of the row 30, a match indicating a predetermined arithmetic relationship with data stored in the row 30 in the form of a predetermined equality or inequality.

The row outputs 34 may be received by a postprocessing network 36 which may generally provide additional logical operations on the outputs of the rows 30 including for example logical combinations of those outputs, as well as minimum, maximum and summation of the number of matches of those outputs. In the example shown, the postprocessing network 36 may in a first switch state provide memory output lines 38 to the bus system 15 indicating an output of single row output 34. This state may be used when each row output 34 indicates whether the search pattern 33 is equal or not equal to a stored value held in the row 30. Alternatively, in a second state, the row outputs 34 may be combined by the range-combining network 36 in an AND combination provided by AND gates 40 of two successive row outputs 34 such as may be used to establish a bounded range. For example, a first row output 34 may indicate whether the search pattern 33 is greater than or equal to a given lower range value stored in the first row 30 and the adjacent row output 34 may indicate whether the search pattern is less than or equal to a given upper range value stored in a second row 30. The AND combination of these two outputs indicates whether the search pattern 33 is within a range defined by a lower and upper range value stored in the first and second rows 30. Setting of the range-combining network 36 may be done by control lines (not shown) controllable by the processor unit 12 or the like.

Referring still to FIG. 1, in the second expansion of that figure, the multiple memory cells 42 of each row 30 maybe interconnected in daisy chain fashion along a row conductor 44. One end of the row conductor 44 is received by a complementing sense amplifier 60 (acting as an inverter) providing row output 34 and the other end is attached to a terminating switch 48 whose operation will be discussed further below.

Each of the memory cells 42 may hold a single bit of stored data in a memory block 50 so that this bit may be compared to an incoming bit of a search pattern 33 along column conductors 32. Generally, there will be many more memory cells 42 than are depicted in this figure in which the number of memory cells 42 is reduced for clarity. In the following description, the left memory cell 42 will receive the most significant bits of the search pattern 33 received along column conductors 32 and this leftmost memory cell 42 connects to the sense amplifier 60 using the row conductor. Conversely the terminating switch 48 connects to the rightmost memory cell 42 using the row conductor 44, the rightmost memory cell 42 receiving the least significant bits of the search pattern 33.

Referring still to FIG. 1, in the third expansion of this figure, each memory cell 42 compares a received bit of the search pattern 33 from column conductor 32 with a bit held in memory block 50 using logic circuitry 54. The logic circuitry 54 compares these bit values according to received programming values over lines 52 (later referred to as OP0 and OP1) which may be used to select any of four possible arithmetic relationships for that comparison. These arithmetic relationships include EQUAL (EQ), GREATER THAN OR EQUAL (GE), LESS THAN OR EQUAL (LE), and NOT EQUAL (NE). The programming lines 52 may be controlled, for example, by memory configuration hardware or the processor unit 12. As will be discussed in more detail below, the same programming values over lines 52 may also implement prefix matching (where the arithmetic relationship is only applied to a prefix of the search pattern 33) including PREFIX EQUALS (Prefix EQ) and PREFIX NOT EQUAL (Prefix NE) as will be discussed below.

An output from the logic circuitry 54 controls a first switch element 56 and a second switch element 58 in the memory cell 42 which each operate in a manner analogous to a two-terminal mechanical single pole, single throw switch as will be discussed in greater detail below but which is implemented in solid-state circuitry.

The first switch element 56 is placed in series along the row conductor 44 as the row conductor 44 passes left to right through the memory cell 42. The second switch element 58 connects to the row conductor 44 as it extends leftward from the first switch element 56. The other end the second switch element 58 connects to ground so that closing the second switch element 58 pulls the row conductor 44 to ground potential. The following discussion will assume a logic sense of ground being a predefined low voltage representing a logical zero or false state in contrast to a predefined positive voltage (for example, 3 volts) representing a logical one or true state. It will be appreciated that this convention may be reversed in other embodiments.

These elements of each memory cell 42 cooperate to allow the memory cell 42 to evaluate a bit of the search pattern 33 arriving on column conductor 32 with its stored bit in memory block 50 with respect to an arithmetic relationship indicated by programming lines 52. This evaluation is used to control first switch element 56 and second switch element 58 either to assert a particular logical state on row conductor 44 or to pass through a logical state from adjacent memory cell 42 via row conductor 44. Examples provided below will explain this operation in more detail for each of the possible arithmetic relationships.

The row conductor 44 from the leftmost memory cell 42 (MSB) is received by the sense amplifier 60

The construction of sense amplifier 60 is well understood in the art and will be represented for purposes of explanation as an inverter having a pull up resistor on its input. It will be recognized that actual sense amplifiers will not use a pull up resistor in favor of active circuitry such as saves static power and provides faster response. The row conductor 44 from the rightmost memory cell (LSB) is received by the terminating switch 48 which includes a transistor 64 operating under the control of driver circuitry 66 to selectively switch row conductor 44 to ground or not depending on the state of programming lines 52 and hence the arithmetic relationship being implemented by the row 30. The details of operation of the transistor 64 with respect to the different arithmetic relationships will be described below.

Figure 2A:
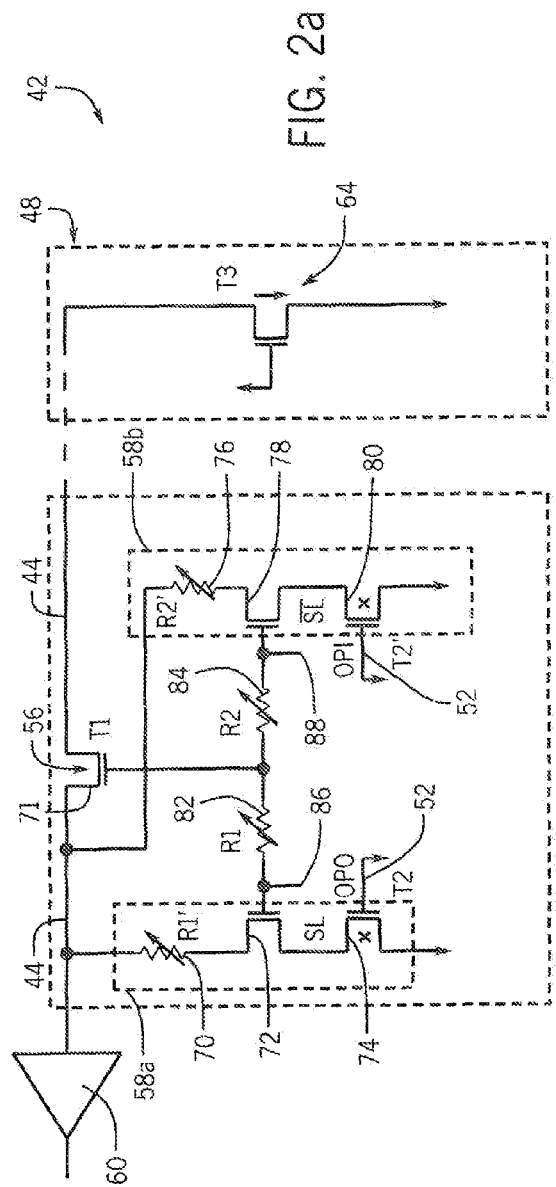
FIGS. 2a and 2b are schematic diagrams of the memory cell and the switch and sense amplifier of its row as configured to implement an EQUAL arithmetic relationship and a simplified block diagram of multiple memory cells showing operation of the memory cells as the memory cells compare a received pattern of 0101 to a stored pattern of 0011.
Figure 2B:
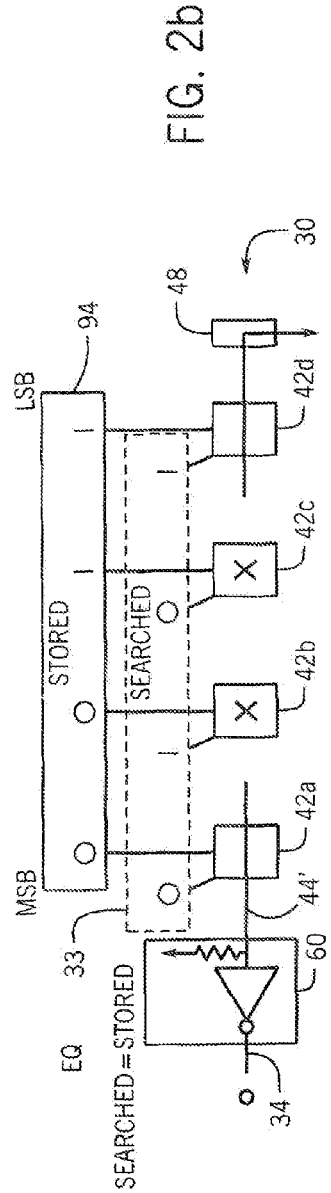

Referring now to FIGS. 1 and 2a and 2b, in each memory cell 42, first switch element 56 (T1) may be a transistor 71, for example, a MOS transistor having a gate and drain connected respectively to left and right portions of the row conductor 44 for the memory cell 42. The second switch element 58 may provide for two parallel-connected switch subunits 58a (T2) and 58b (T2'). Switch subunit 58a is provided by the combination of a programmable resistor 70 (also designated R1') attached to the row conductor 44 extending leftward from the first switch element 56 and connected in series with transistors 72 and 74 (successively through their gates and drains), the latter transistor 74 which connects the ground. Switch subunit 58b is provided by programmable resistor 76 (also designated R2') connected in series with transistors 78 and 80 with the latter transistor 80 providing a path ground. Transistors 72, 74, 78 and 80 may also be MOS transistors.

Generally when transistor 72 and 74 are conducting and programmable resistor 70 has been programmed to have a low resistance, conductor 44 leading leftward from transistor 71, T2 will be closed and the leftward conductor 44 will be pulled to a low state. Likewise when transistors 78 and 80 are conducting and programmable resistor 76 is programmed to have a low resistance, T2' will be closed and row conductors 44 leading leftward from transistor 71 will be pulled to a low state.

The inputs of transistor 74 and 80 (gates) respectively receive signals OP0 and OP1 on programming lines 52 which designate a particular arithmetic relationship to be implemented by the memory cell 42. When these signals OP0 and OP1 are high, the respective transistors 74 and 80 are turned on to be conducting. The input of transistor 64 also receives signals OP0 and OP1 to be activated except when both of these signals are high. The following logic may be used on these programming lines 52 to designate the arithmetic relationship:

Table I

TABLE I

| OP0 | OP1 | Arithmetic relationship | Transistor 74 | Transistor 80 | T3 |
|---|---|---|---|---|---|
| 0 | 0 | EQ | Off | Off | On |
| 1 | 0 | GE | On | Off | On |
| 0 | 1 | LE | Off | On | On |
| 1 | 1 | NE | On | On | Off |
| 1 | 1 | Prefix EQ | On | On | Off |
| 1 | 1 | Prefix NE | On | On | Off |

The gates of transistor 72 and 78 are joined by series connected programmable resistors 82 and 84 also designated R1 and R2 respectively with resistor 82 connecting directly to the gate of transistor 72 and resistor 84 connecting directly to the gate of transistor 78. The junction of these two resistors 82 and 84 connects to the gate of transistor 71 forming switch T1.

Each of the programmable resistors 70, 76, 82, and 84 provide in their programmed resistance, data storage capabilities that serve to store data (one bit) in each of the memory cells 42. The programmable resistors 70, 76, 82, and 84 may implement any of a variety of different resistance storage techniques, for example, of phase change memory (PCM), conductive bridging RAM (CBRAM), or similar technologies such as resistive random access memory (ReRAM), the latter growing filaments through dielectrics. All of these technologies provide a nonvolatile change in resistance between at least two values according to an electrical programming sequence affecting material properties of the resistor element. In the present invention, the state of these programmable resistors 70, 76, 82 and 84 can be changed between a high resistance value (R) and a low resistance value (r) by the application of electrical currents to these elements during a programming phase using programming conductors (not shown for clarity) according to techniques generally understood in the art.

The programmable resistors 70, 76, 82, 84 provide both functions of the memory block 50 and of the logic circuitry 54 (as shown in FIG. 1) thereby greatly reducing the component count of the memory cell 42.

Referring still to FIG. 2a, a bit from the search pattern 33 along one column conductor 32 may be received in complementary form along pattern input conductor 86 (also designated SL) and pattern input conductor 88 (also designated $\overline{SL}$), the latter having the complement of the logical state of conductor 86. These two different signals on conductors 86 and 88 may be generated from a single column conductor 32 using a column inverter (not shown) shared among all rows 30 and thus not being part of the parts count of the memory cell 42.

In operation, the above-described components of the memory cell 42 may evaluate the bit represented by conductors 86 and 88 against a stored bit value collectively represented by the program to resistance values of resistors 70, 76, 82, and 84. This evaluation controls transistors 72, 78 and 71 to produce row output 34 for each row 30 being a logical combination of signals from multiple memory cells 42 according to an evaluation performed by the memory cell 42 of their portion of the search pattern 33 against their portion of the stored value. Generally conductor 44 provides a "wired ANDing" of the evaluation performed by each memory cell 42 by combining voltages imposed by a second switch element 58 for each memory cell 42 on the conductor 44 as connected to output 34 according to the first switch element 56. This combination proceeds generally from left to right giving precedence to memory cells 42 to its left representing higher order bits and closer to sense amplifier 60.

Detailed explanation of this process will be provided using the four following examples which each consider a simple row 30 having four memory cells 42a-c receiving a four-bit search pattern 33 of 0011 (binary) and comparing it to four bits of stored pattern 94 of 0101 (binary). In each of the following examples, the data stored in each memory cell 42 will be encoded as high and low resistance as in the programmable resistors 70, 76, 82, and 84 as follows:

TABLE II

| stored value | R1 | R1' | R2 | R2' |
|---|---|---|---|---|
| 0 (EQ, GE, LE, NE) | High (R) | Low (r) | Low (r) | High (R) |
| 1 (EQ, GE, LE, NE) | Low (r) | High (R) | High (R) | Low (r) |
| 0 (Prefix EQ) | High (R) | High (R) | Low (r) | High (R) |
| 1 (Prefix EQ) | Low (r) | High (R) | High (R) | High (R) |
| X (Prefix EQ) | High (R) | Low (r) | Low (r) | Low (r) |
| 0 (Prefix NE) | High (R) | Low (r) | Low (r) | High (R) |
| 1 (Prefix NE) | Low (r) | High (R) | High (R) | Low (r) |
| X (Prefix NE) | High (R) | High (R) | Low (r) | High (R) |

Note that the distinction between the arithmetic operations of EQUAL, LESS THAN OR EQUAL, GREATER THAN OR EQUAL, and NOT EQUAL versus PREFIX EQUAL and PREFIX NOT EQUAL are implemented through the storage of resistance values rather than the control values of OP0 and OP1.

EXAMPLE I (EQ)

Referring now to FIGS. 2a and 2b, when the memory cells 42 are configured in the EQUAL arithmetic relationship per Table I (by means of signals on lines 52), switches T2, T2' will be in the state shown in the above Table I with transistor 74 and 80 off. Switch T3 of terminating switch 48 will be connected to ground through transistor 64

In the first memory cell 42a, SL will have value of 0 and $\overline{SL}$ will have a value of 1. Resistor 82 will be high in resistance compared to resistor 84 raising the bias on the gate of T1 causing it to conduct or be turned on. This joins left- and right-going conductors 44 together so that the leftmost conductor 44 passes through the output from the lower ordered memory cell 42b.

Switch subunits 58a and 58b are off as a result of the off state of switches T2 and T2' described above.

Because there is an equality with respect to the bits examined by memory cell 42a, row output 34 will be determined by the evaluation of lower bit order memory cells starting with memory cell 42b.

As an aside, it will be appreciated that if each earlier (lower ordered) memory cell 42 determines that its portion of the comparison problem satisfies the EQUAL arithmetic relationship, output 34 will be connected directly to the terminating switch 48 and, through the terminator switch T3, connected to ground. This ground signal would then be received by the sense amplifier 60 to provide a high state output 34 indicating that the comparison process indicated an EQ arithmetic relationship between the received search pattern 33 in the stored data.

In the current example, at memory cell 42b there is an inequality between the second most significant bits of the search pattern 33 and stored pattern 94 that contradicts the EQ arithmetic relationship. For this memory cell 42b, the next bit of the search pattern 33 is 1 so the values of SL and $\overline{SL}$ are 1 and 0 respectively, but the next bit of the stored pattern 94 is 0 meaning that resistor 82 is larger than resistor 84 turning off transistor T1. In addition, switch subunits 58a and 58b are still off causing row conductor 44' connected to the sense amplifier 60 to be pulled up by resistor 61 resulting in a zero output from sense amplifier 60 indicating a lack of equality.

The remaining memory cells 42c and 42d have been disconnected by memory cell 42b and so do not affect the output 34; however, the inequality present at memory cell 42c means that its switch T1 is also disconnected while the equality present at memory cell 42d means that its switch T1 is closed.

EXAMPLE II (GE)

Referring now to FIGS. 3a and 3b, when the memory cells 42 are configured in the GREATER THAN OR EQUAL (GE) arithmetic relationship per Table I, transistors 74 and 80 will be in the state shown in the above Table I with transistor 74 on and transistor 80 off. Switch T3 of terminating switch 48 will be connected to ground through transistor 64. GE will produce a logical true value (1) if the searched value is greater than or equal to the stored value.

In the first memory cell 42a, SL will have value of 0 and $\overline{SL}$ will have a value of 1. Resistor 82 will be high in resistance compared to resistor 84 raising the bias on the gate of T1 causing it to conduct. This joins left- and right-going conductors 44 together so that the leftmost conductor 44 passes through the output from the lower ordered memory cell 42b.

Switch subunit 58a is off by virtue of transistor 72 being off (because of the low value of SL) and switch subunit 58b is off as a result of the state of switch T2'.

Because there is an equality with respect to the bits examined by memory cell 42a, row output 34 will be determined by the evaluation of lower bit order memory cells starting with memory cell 42b.

At memory cell 42b there is an inequality between the second most significant bit of the search pattern 33 and stored pattern 94 that favors the GE condition. For this memory cell 42b, the next bit of the search pattern 33 is 1 so the values of SL and $\overline{SL}$ are 1 and 0, respectively, but the next bit of the stored pattern 94 is 0 meaning that resistor 82 is larger than resistor 84 turning off transistor T1. In this case switch subunit 58a is turned on because transistor 72 is on as a result of the value of SL and switch subunit 58b is turned off because transistor 80 is off as a result of the value of OP1. This causes row conductor 44' to be pulled to ground resulting in a 1 value at output 34 from sense amplifier 60 indicating the satisfaction of the GE condition.

The remaining memory cells 42c and 42d have been disconnected by memory cell 42b and so do not affect the output 34; however, the relevant received bit of the search pattern 33 at memory cell 42c is a less than the bit of stored pattern 94 present at memory cell 42c meaning that its switch T1 is open and its row conductor 44 is not connected to ground. The equality present at memory cell 42d means that its switch T1 is closed while switch subunits 58a and 58b are open.

EXAMPLE III (LE)

Figure 4A:
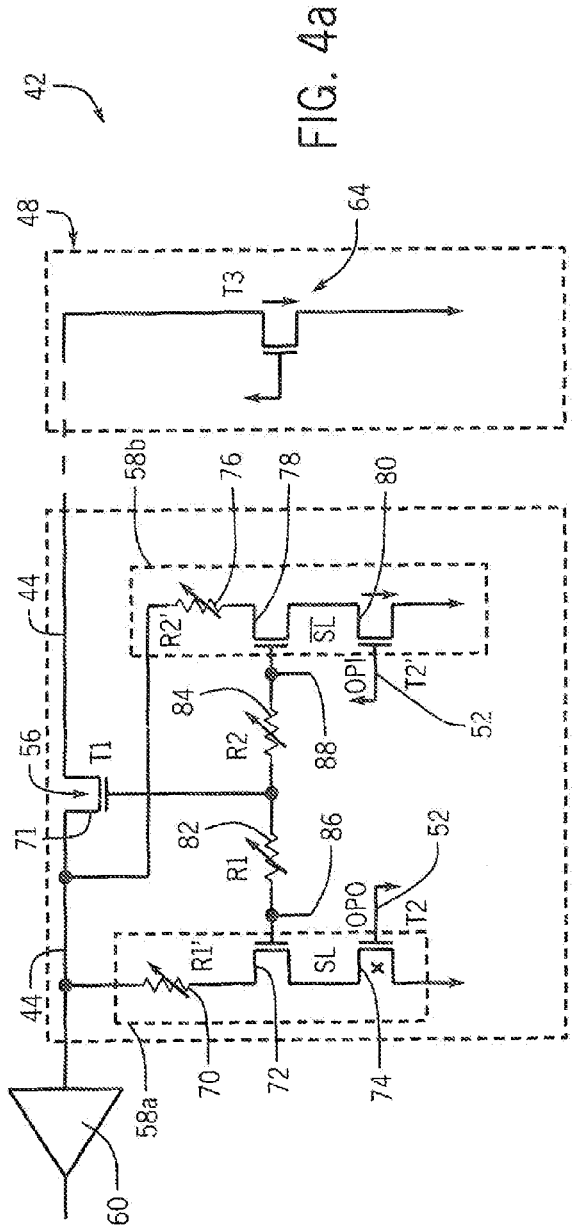
FIGS. 4a and 4b are figures similar to FIGS. 3a and 3b showing the memory cells configured to implement a LESS THAN OR EQUAL arithmetic relationship.
Figure 4B:
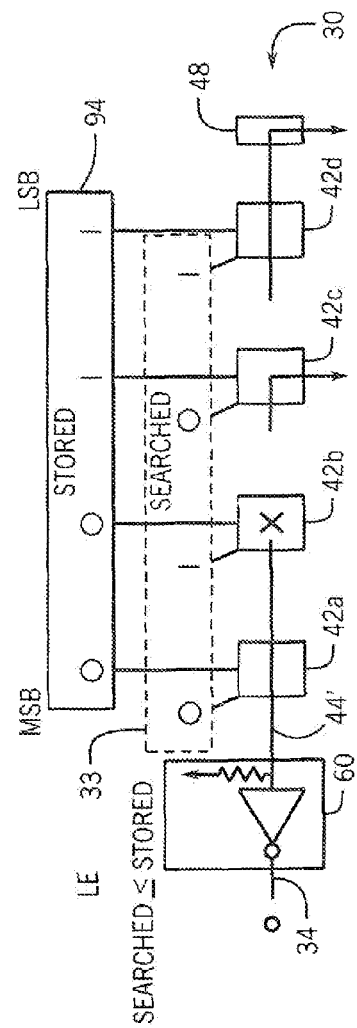

Referring now to FIGS. 4a and 4b, when the memory cells 42 are configured in the LESS THAN OR EQUAL (GE) arithmetic relationship per Table I, transistors 74 and 80 will be in the state shown in the above Table I with transistor 74 off and transistor 80 on. Switch T3 of terminating switch 48 will be connected to ground through transistor 64. LE will produce a logical true value (1) if the searched value is less than or equal to the stored value.

In the first memory cell 42a, SL will have value of 0 and $\overline{SL}$ will have a value of 1. Resistor 82 will be high in resistance compared to resistor 84 raising the bias on the gate of T1 causing it to conduct. This joins left- and right-going conductors 44 together so that the leftmost conductor 44 passes through the output from the lower ordered memory cell 42b.

Switch subunit 58a is off by virtue of transistor 72 being off (because of the low value of SL) and switch subunit 58b is off as a result of the high value of programmable resistor 76.

Because there is an equality with respect to the bits examined by memory cell 42a, row output 34 will be determined by the evaluation of lower bit order memory cells starting with memory cell 42b.

At memory cell 42b there is an inequality between the second most significant bits of the search pattern 33 and stored pattern 94 that contradicts the LE condition. For this memory cell 42b the next bit of the search pattern 33 is 1 so the values of SL and $\overline{SL}$ are again 1 and 0, respectively, but the next bit of the stored pattern 94 is 0 meaning that resistor 82 is larger than resistor 84 turning off transistor T1. In this case, switch subunit 58a is off because transistor 74 is off as a result of the value of OP1, and switch subunit 58b is off as a result of the high resistance of resistor 76. This causes row conductor 44' to be pulled up by resistor 61 resulting in a 0 output 34 from output sense amplifier 60 indicating the failure of the LE condition.

The remaining memory cells 42c and 42d have been disconnected by memory cell 42b and so do not affect the output 34; however, the relevant received bit of the search pattern 33 is a less than the bit of stored pattern 94 present at memory cell 42c meaning that its switch T1 is open and the switch subunit 58a is open and switch subunit 58b is closed. The equality present at memory cell 42d means that its switch T1 is closed while switch subunits 58a and 58b are open.

EXAMPLE IV (NE)

Figure 5A:
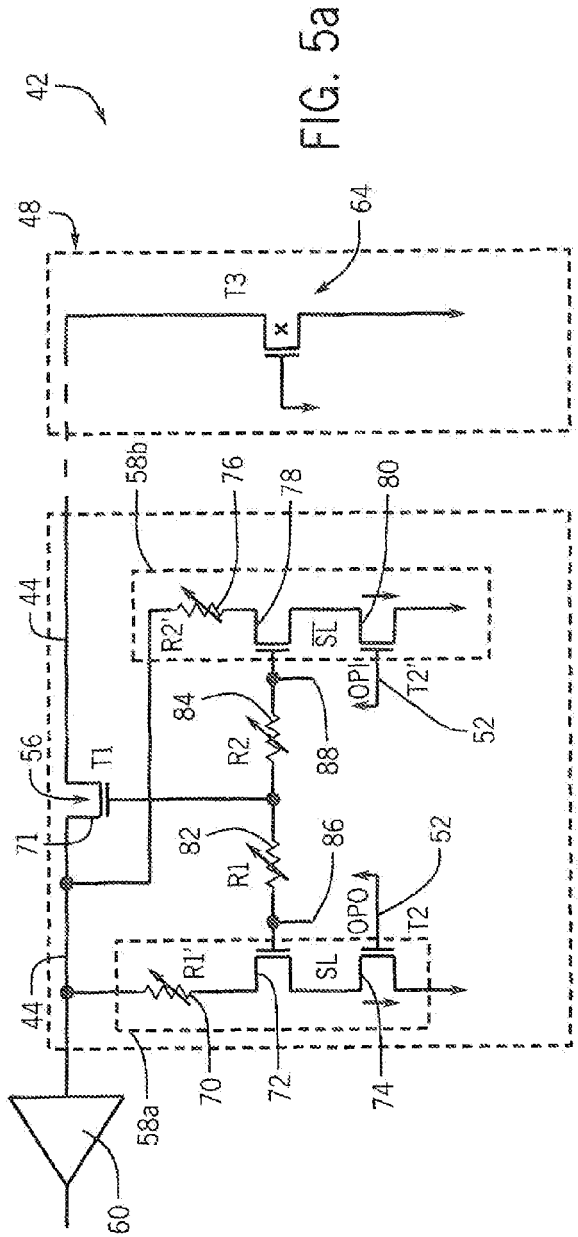
FIGS. 5a and 5b are figures similar to FIGS. 3a and 3b showing the memory cells configured to implement a NOT EQUAL arithmetic relationship.
Figure 5B:
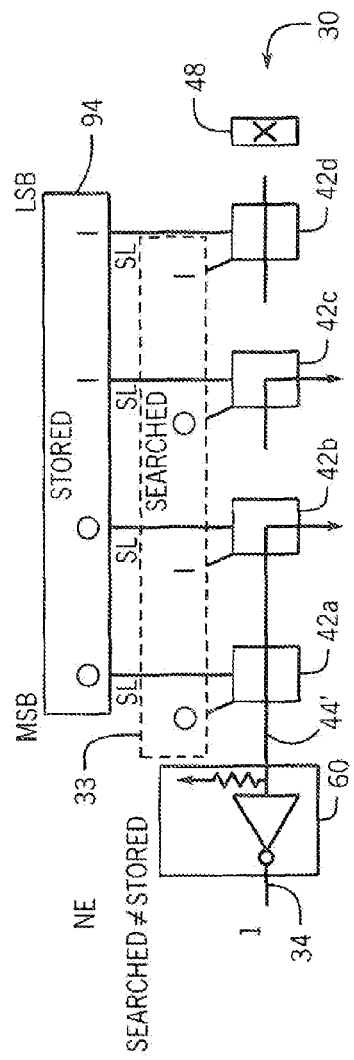

Referring now to FIGS. 5a and 5b, when the memory cells 42 are configured in the NOT EQUAL (NE) arithmetic relationship per Table I, transistors 74 and 80 will be in the state shown in the above Table I with transistor 74 on and transistor 80 on. Switch T3 of terminating switch 48 will be off.

In the first memory cell 42a, SL will have value of 0 and $\overline{SL}$ will have a value of 1. Resistor 82 will be high in resistance compared to resistor 84 raising the bias on the gate of T causing it to conduct. This joins left- and right-going conductors 44 together so that the leftmost conductor 44 passes through the output from the lower ordered memory cell 42b.

Switch subunit 58a is off by virtue of transistor 72 being off (because of the low value of SL) and switch subunit 58b is off as a result of the high value of programmable resistor 76.

Because there is an equality with respect to the bits examined by memory cell 42a, row output 34 will be determined by the evaluation of lower bit order memory cells starting with memory cell 42b.

At memory cell 42b there is an inequality between the second most significant bits of the search pattern 33 and stored pattern 94 that supports the NE evaluation. For this memory cell 42b the next bit of the search pattern 33 is 1 so the values of SL and $\overline{SL}$ are 1 and 0, respectively, but the next bit of the stored pattern 94 is 0 meaning that resistor 82 is larger than resistor 84 turning off transistor T1. In this case switch subunit 58a is on because transistor 72 is on and programmable resistor 70 is low and switch subunit 58b is off because transistor 78 is off. This causes row conductor 44' to be pulled down resulting in a 1 output 34 from sense amplifier 60 indicating the satisfaction of the NE condition.

If the memory cells 42b-42d determine that their relevant bits are equal, it can be seen that each of the switches T1 will be closed connecting the row conductor 44' directly to the terminating switch 48. Because the switch T3 in the terminating switch 48 is not connected to ground, this will result in the row conductor 44' being pulled up to a value of 1 making the output 34 equal to zero indicating that the NE condition is not satisfied.

The remaining memory cells 42c and 42d have been disconnected by memory cell 42b and so do not affect the output 34; however, the relevant received bit of the search pattern 33 is greater than the corresponding bit of the stored value present at memory cell 42c, meaning that its switch T1 is open and the switch subunit 58a is open and switch subunit 58b is closed. The equality present at memory cell 42d means that its switch T1 is closed while switch subunits 58a and 58b are open.

EXAMPLE V (Prefix EQ)

Referring now to FIGS. 6a and 6b, when the memory cells 42 are configured in the PREFIX EQUAL (Prefix EQ) arithmetic relationship per Table I, transistors 74 and 80 will be in the state shown in the above Table I with transistor 74 on and transistor 80 on. Switch T3 of terminating switch 48 will be open. Prefix EQ will produce a logical true value (1) if the searched value is equal to those bits of the stored value before the first don't care bit (X).

In the first memory cell 42a, SL will have value of 0 and $\overline{SL}$ will have a value of 1. Per Table II, resistor 82 will be high in resistance compared to resistor 84 raising the bias on the gate of T1 causing it to conduct. This joins left- and right-going conductors 44 together so that the leftmost conductor 44 passes through the output from the lower ordered memory cell 42b.

Switch subunit 58a is off by virtue of transistor 72 being off (because of the low value of SL) and also because of the high value of resistor 70 and switch subunit 58b is off as a result of the state of the high value of resistance 76.

Because there is an equality with respect to the bits examined by memory cell 42a, row output 34 will be determined by the evaluation of lower bit order memory cells starting with memory cell 42b.

At memory cell 42b the stored value has an X or don't care state. This is implemented by setting resistor 82 to a high-value, resistor 72 are low value, resistor 84 door low value and resistor 76 to a low value. In this case switch 56 will be turned off and switch subunit 58a is turned on because transistor 72 is on as a result of the value of SL and switch subunit 58b is turned off because transistor 78 is off. This causes row conductor 44' to be pulled to ground resulting in a 1 value at output 34 from sense amplifier 60 indicating the satisfaction of the Prefix EQ condition.

The remaining memory cells 42c and 42d have been disconnected by memory cell 42b and so do not affect the output 34; however the don't care bit X for each of these memory cells 42c and 42d provides resistance values that ensures that switch 56 is turned off as discussed with respect to memory cell 42b. In memory cell 42c the zero value of SL causes switch 58b to be connected to ground. In memory cell 42d the one value of SL (as in the case of memory cell 42b, causes switch 58a to be connected to ground.

This example will also serve to illustrate the operation of the Prefix NE case making the adjustments in resistance values per Table II for the don't care bits and applying the analysis described with respect to FIG. 5.

Figure 7:
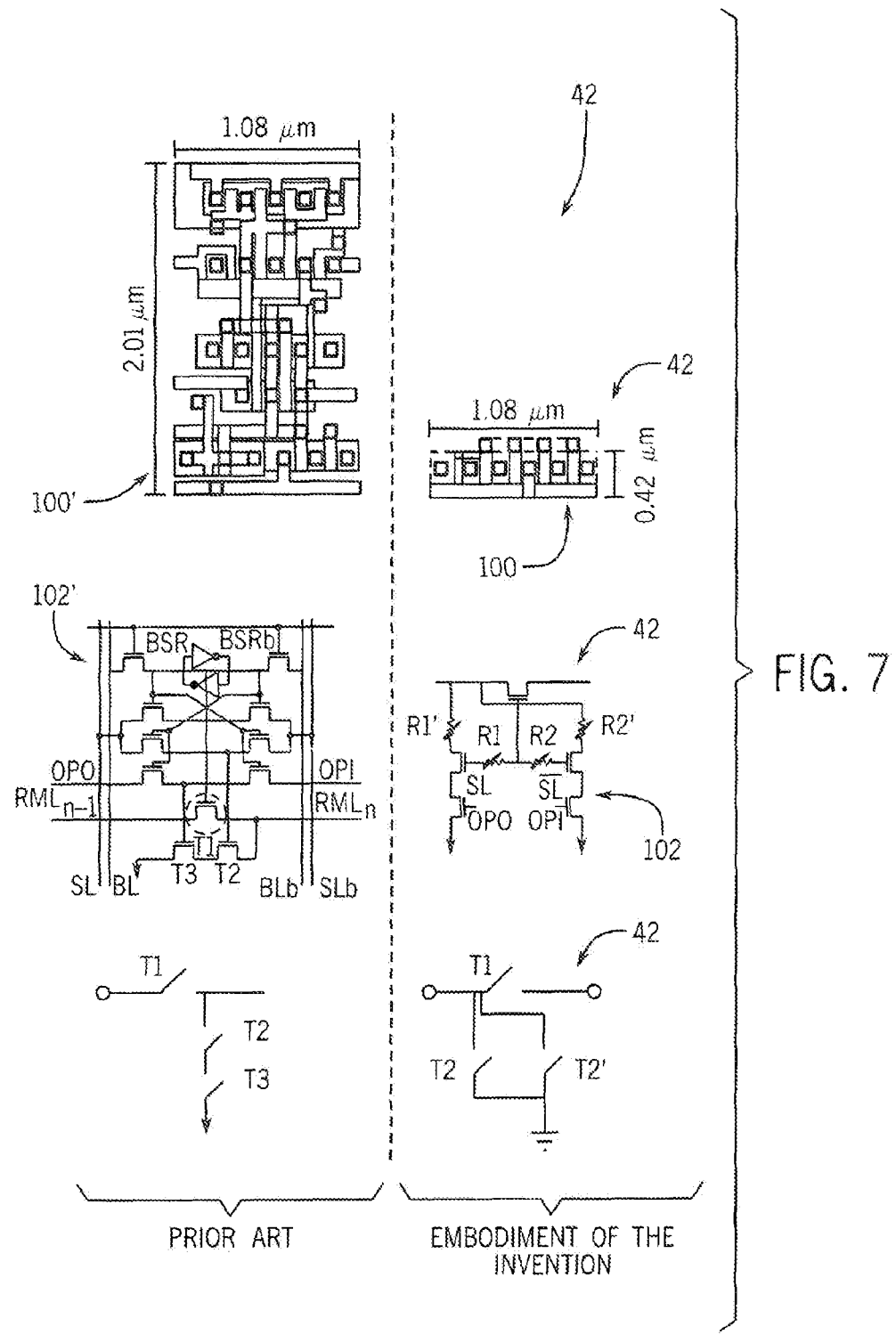
FIG. 7 is a diagram comparing an example prior art range-matching, content addressable memory cell to one embodiment of the range-matching, content addressable memory of the present invention, each memory cell represented by its integrated circuit mask, a simplified schematic, and a functional diagram.

Referring now to FIG. 7, the memory cells 42 of the present invention provide a substantially reduced mask size 100 with respect to the mask size 100' of a typical prior art RMCAM. This particular prior art design is described in Kim, Y.-D., Ahn, H.-S., Kim, S., and Jeong, D.-K. A High-Speed Range-Matching TCAM for Storage-Efficient Packet Classification. IEEE Transactions on Circuits and Systems I: Regular Papers, June 2009, Vol. 56 (6), 2009, pp. 1221-1230. The memory cell schematic 102 requires only five transistors and four resistive elements per memory cell 42 in contrast to the prior art schematic 102' providing in excess of 13 transistors. Functionally, the present invention provides a single bypass switch T1 with two parallel-connected grounding switches T2 and T2' in contrast to the single bypass switch T1 and series-connected switches T2 and T3 of the prior art.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

Logical rows and columns are intended to be a construction for clarity of description and should not be understood as requiring actual columns or rows of conductors or elements or any particular orientation.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications are hereby incorporated herein by reference in their entireties.

What I claim is:

1. A content addressable memory providing range-matching comprising:
    a set of memory cells arranged in logical rows and columns adapted to receive an input pattern in parallel along the columns and to provide a row output for each given row of memory cells evaluating the input pattern with respect to stored values of the memory cells of the given row;
    wherein each memory cell includes:
    (a) a pattern input receiving a portion of the input pattern;
    (b) a resistive memory holding a portion of the stored values in resistive states of resistive elements;
    (c) programming inputs receiving programming data describing a given arithmetic relationship from a set of arithmetic relationships including equality and inequalities;
    (d) transistor logic circuitry evaluating the portion of the input pattern and the portion of the stored values using the given arithmetic relationship of the programming inputs; and
    (e) at least one output adapted to combine the evaluation of the transistor logic circuitry of the memory cell with the evaluation of the other memory cells to provide the row output indicating whether stored values of the memory cells of a row holding the memory cell have the given arithmetic relationship with respect to the input pattern.

2. The content addressable memory of claim 1 wherein the given arithmetic relationships are selected from the group consisting of EQUAL, GREATER THAN OR EQUAL, and LESS THAN OR EQUAL.

3. The content addressable memory of claim 2 wherein the given arithmetic relationships include NOT EQUAL.

4. The content addressable memory of claim 1 wherein the stored values of the memory cells include logic 0, logic 1 and don't care state values.

5. The content addressable memory of claim 3 wherein the content addressable memory further includes a switch element associated with the memory elements in each row and providing a switchable path between the row output and a predetermined logical voltage level as a function of whether the given arithmetic relationship is NOT EQUAL and the relationship between the stored values and the input pattern is equal.

6. The content addressable memory of claim 1 wherein the resistive memory includes a first and second resistive element storing a single bit of the portion when configured to have complementary resistive states.

7. The content addressable memory of claim 6 wherein the first and second resistors are connected in series to provide a resistive bridge across voltages representing complementary representations of a bit of the input pattern to which the single bit of the portion will be compared.

8. The content addressable memory of claim 7 wherein a junction between the first and second resistors of the resistive bridge controls an electrical switch interconnecting the memory cell to a neighboring memory cell to provide the at least one output.

9. The content addressable memory of claim 1 further including a third and fourth resistor in parallel between the at least one output and a predetermined logical voltage level independently switchable by the transistor logic circuitry to bring the output to the predetermined logical voltage level.

10. The content addressable memory of claim 1 wherein the memory elements each include a first and second switch element controlled by the transistor logic circuitry and wherein the first switch element of the memory elements are connected in series by means of the at least one output of the memory cells to provide the row output and wherein the second switch operates to connect the at least one output-predetermined logic level under control of the transistor logic circuitry.

11. The content addressable memory of claim 10 wherein the second switch element includes two independently controllable switches is in parallel independently controlled by the logic circuitry.

12. The content addressable memory of claim 1 wherein each memory cell includes no more than five transistors.

13. The content addressable memory of claim 12 wherein each memory cell includes only five transistors.

14. The content addressable memory of claim 13 wherein the memory cell includes no more than four resistive elements.

15. The content addressable memory of claim 14 wherein the resistive elements store data by means of phase change related resistance changes.

16. A method of range-matching in a content addressable memory of a type including:
    a set of memory cells arranged in logical rows and columns adapted to receive an input pattern in parallel along the columns and to provide a row output for each given row of memory cells evaluating the input pattern with respect to stored values of the memory cells of the given row;
    wherein each memory cell includes:
    (a) a search input receiving a portion of the input pattern;
    (b) a resistive memory holding a portion of the stored values in resistive states of resistive elements;

(c) programming inputs receiving programming data describing a given arithmetic relationship from a set of arithmetic relationship including equality and inequalities;

(d) transistor logic circuitry evaluating the portion of the search pattern and the portion of the stored values using the given arithmetic relationship of the programming inputs; and (e) at least one output adapted to combine the evaluation of the transistor logic circuitry with the evaluation of the other memory cells to provide the row output indicating whether stored values of the memory cells of each row have the given arithmetic relationship with respect to the input pattern; the method comprising:

(1) programming the resistive memory of a row of memory cells with stored values indicating a desired range;

(2) evaluating the received input pattern with the stored values of the row of memory cells using the transistor logic circuits in the memory cells; and (3) outputting a row output combining the evaluation of the transistor logic circuits of the memory cells of the row indicating the relationship between the received pattern and the stored values.

17. The method of claim 16 further including the step of applying different programming inputs in parallel to each memory cell at least two rows, the programming inputs providing logic selected from the group consisting of EQUAL, GREATER THAN, and LESS THAN.

18. The method of claim 16 wherein one programming input is NOT EQUAL.

19. The content addressable memory of claim 1 wherein the stored values of the memory cells include don't care state values.

20. A method of claim 16 wherein the received pattern inputs are Internet packet data.

* * * * *